United States Patent
Kato

(10) Patent No.: US 7,948,290 B2
(45) Date of Patent: May 24, 2011

(54) DIGITAL PLL DEVICE

(75) Inventor: Syuji Kato, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/439,644

(22) PCT Filed: Jul. 8, 2008

(86) PCT No.: PCT/JP2008/001827
§ 371 (c)(1),
(2), (4) Date: Mar. 2, 2009

(87) PCT Pub. No.: WO2009/013860
PCT Pub. Date: Jan. 29, 2009

(65) Prior Publication Data
US 2010/0001773 A1 Jan. 7, 2010

(30) Foreign Application Priority Data
Jul. 23, 2007 (JP) .................. 2007-190405

(51) Int. Cl.
*H03L 7/06* (2006.01)
(52) U.S. Cl. .................. 327/159; 327/150
(58) Field of Classification Search .................. None
See application file for complete search history.

(56) References Cited

U.S. PATENT DOCUMENTS

| | | | | |
|---|---|---|---|---|
| 4,813,005 A | * | 3/1989 | Redig et al. | 702/117 |
| 5,028,887 A | * | 7/1991 | Gilmore | 331/18 |
| 5,265,081 A | | 11/1993 | Shimizume et al. | |
| 5,834,987 A | * | 11/1998 | Dent | 332/127 |
| 5,945,856 A | | 8/1999 | Yanagiuchi | |
| 5,970,110 A | * | 10/1999 | Li | 377/48 |
| 6,097,777 A | | 8/2000 | Tateishi et al. | |
| 6,111,470 A | * | 8/2000 | Dufour | 331/17 |
| 6,188,290 B1 | * | 2/2001 | Fallisgaard et al. | 331/18 |
| 6,333,678 B1 | * | 12/2001 | Brown et al. | 331/2 |
| 6,650,193 B2 | * | 11/2003 | Endo et al. | 331/78 |
| 6,687,841 B1 | | 2/2004 | Marukawa | |

(Continued)

FOREIGN PATENT DOCUMENTS
CN 1409490 A 4/2003
(Continued)

OTHER PUBLICATIONS
High-Definition Multimedia Interface Specification Version 1.3a, Nov. 10, 2006.
(Continued)

*Primary Examiner* — Cassandra Cox
(74) *Attorney, Agent, or Firm* — McDermott Will & Emery LLP

(57) ABSTRACT

An input clock dividing unit frequency-divides an input clock, and an input clock multiplying unit frequency-multiplies the input clock. An operation clock selecting unit selects the frequency-divided clock when the input clock is fast and selects the frequency-multiplied clock when the input clock is slow, based on the frequency detection result of frequency detecting unit. The operation clock selecting unit then outputs the selected clock to a phase comparing unit as an operation clock. The phase comparing unit operates according to the frequency-divided or frequency-multiplied clock, and controls an oscillating unit so that the phase difference between a reference signal and a comparison signal becomes zero. The phase of an output clock is thus caused to track the phase of the reference signal.

11 Claims, 7 Drawing Sheets

U.S. PATENT DOCUMENTS

| | | | |
|---|---|---|---|
| 6,741,846 B1* | 5/2004 | Welland et al. | 455/260 |
| 6,753,711 B2* | 6/2004 | McCollum et al. | 327/156 |
| 6,882,229 B1* | 4/2005 | Ho et al. | 331/1 A |
| 7,215,165 B2* | 5/2007 | Yamamoto et al. | 327/156 |
| 7,301,414 B2* | 11/2007 | Hino | 331/179 |
| 7,312,649 B2* | 12/2007 | Origasa et al. | 327/536 |
| 7,394,870 B2* | 7/2008 | Chien et al. | 375/316 |
| 7,436,264 B2* | 10/2008 | Yu | 331/17 |
| 7,512,205 B1* | 3/2009 | Erol | 375/376 |
| 2001/0017573 A1* | 8/2001 | Fallisgaard et al. | 331/18 |
| 2006/0171496 A1 | 8/2006 | Nakamuta et al. | |
| 2006/0176525 A1* | 8/2006 | Mizuta et al. | 358/474 |

FOREIGN PATENT DOCUMENTS

| | | |
|---|---|---|
| JP | 10-224336 | 8/1998 |
| JP | 2003-347933 | 12/2003 |
| JP | 2004-289557 | 10/2004 |
| JP | 2007-082001 | 3/2007 |
| JP | 2007-088898 | 4/2007 |

OTHER PUBLICATIONS

Japanese Notice of Reasons for Rejection, with English translation, issued in Japanese Patent Application No. 2008-554553, dated Jun. 29, 2010.

* cited by examiner

DIGITAL PLL DEVICE

RELATED APPLICATIONS

This application is the U.S. National Phase under 35 U.S.C. §371 of International Application No. PCT/JP2008/001827, filed on Jul. 8, 2008, which in turn claims the benefit of Japanese Application No. 2007-190405, filed on Jul. 23, 2007, the disclosures of which Applications are incorporated by reference herein.

TECHNICAL FIELD

The present invention generally relates to a digital PLL device. More particularly, the present invention relates to a digital PLL device that is used for, for example, regeneration of an audio clock from a clock transmitted through a digital interface such as IEEE 1394 and HDMI (High-Definition Multimedia Interface) used in a digital television and an AV amplifier.

BACKGROUND ART

Many digital interfaces employ a system in which a parameter is created by a transmitting party according to a predetermined formula and a required audio clock is regenerated from a transmitted clock by using the parameter. As a typical structure of this system, a digital PLL is used by itself or in combination with an analog PLL.

It has been common in the art to use a transmitted clock as an operation clock of a digital PLL for regenerating a clock (e.g., see Non-patent document 1).

FIG. 7 is a block diagram showing a structure of a conventional digital PLL device.

The conventional digital PLL device of FIG. 7 includes an n dividing unit 1, a phase comparing unit 2, an oscillating unit 3, and an m dividing unit 4.

As shown in FIG. 7, the n dividing unit 1 frequency-divides a clock transmitted through a digital interface by n to produce a digital PLL reference signal. The phase comparing unit 2 operates by using the transmitted clock as an operation clock. The phase comparing unit 2 obtains the phase difference between the reference signal generated by the n dividing unit 1 and a comparison signal generated by dividing an output clock by m in the m dividing unit 4, and outputs a control signal so as to reduce the phase difference. The oscillating unit 3 changes the output clock by the control signal received from the phase comparing unit 2. This operation is repeated as a feedback loop, whereby the phase of the output clock is caused to track (lock to) the phase of the reference signal.

For example, in an HDMI specification, parameters N and CTS are prepared as parameters for regenerating an audio clock. These parameters are defined by the following formula:

$$CTS = (\text{transmitted clock} \times N)/(128 \times Fs)$$

where Fs (Sampling Frequency) indicates an audio clock.

A source device as a transmitter determines the value of CTS by counting the number of transmitted clocks in each of the (128×Fs/N) clocks. A sink device as a receiver frequency-divides the transmitted clock by CTS to generate a digital PLL reference signal. By repeating an operation of comparing the phase of a comparison signal generated by frequency-dividing an output signal by N with the phase of the generated reference signal and controlling the output clock so that the phase difference becomes zero, the phase of the comparison signal is caused to track the phase of the reference signal. By thus locking the output clock to (128×Fs), Fs can be regenerated by the sink device.

Non-patent document 1: High-Definition Multimedia Interface Specification Version 1.3a

DISCLOSURE OF THE INVENTION

Problems to be Solved by the Invention

When a transmitted clock is fast in the above conventional digital PLL device, an operation clock is fast, causing increase in circuit scale and significant increase in power consumption. When the transmitted clock is slow, on the other hand, the operation clock is slow, causing increase in jitter and increase in tracking time.

The transmitted clock has been increasingly becoming faster especially due to Deep Color defined in the HDMI specification, recent higher definition of image, and the like. Under such circumstances, conventional digital PLL devices have been increasingly suffering from problems such as increased circuit scale and significantly increased power consumption.

The conventional PLL devices thus have problems such as increased circuit scale, increased power consumption, increased jitter, and increased tracking time depending on the transmitted clock rate.

In view of the above problems, it is an object of the present invention to provide a digital PLL device having a structure capable of suppressing increase in circuit scale and increase in power consumption when a transmitted clock is fast, and to provide a digital PLL device having a structure capable of suppressing increase in jitter and increase in tracking time when a transmitted clock is slow.

Means for Solving the Problems

In order to achieve the above object, a digital PLL device according to one aspect of the present invention includes: an operation clock generating unit configured to output a frequency-divided or frequency-multiplied input clock as an operation clock; an n dividing unit configured to frequency-divide an input clock by n to output a reference signal; a phase comparing unit configured to compare the reference signal with a comparison signal and output a control signal; an oscillating unit configured to change an oscillation frequency of an output clock according to the control signal; and an m dividing unit configured to frequency-divide the output clock by m to output the comparison signal.

In the digital PLL device according to the above aspect of the present invention, the operation clock generating unit is an output clock dividing unit configured to frequency-divide the input clock and output the resultant clock as the operation clock.

In this case, the n dividing unit frequency-divides the operation clock instead of the input clock by n to output the reference signal, and the digital PLL device further includes an input clock multiplying unit configured to frequency-multiply an output of the oscillating unit and output the resultant clock.

In the digital PLL device according to the above aspect of the present invention, the operation clock generating unit is an input clock multiplying unit configured to frequency-multiply the input clock and output the resultant clock as the operation clock.

In this case, the n dividing unit frequency-divides the operation clock instead of the input clock by n to output the reference signal, and the digital PLL device further includes an output clock dividing unit configured to frequency-divide an output of the oscillating unit and output the resultant clock.

In the digital PLL device according to the above aspect of the present invention, the operation clock generating unit further includes an input clock dividing unit configured to frequency-divide the input clock and output the resultant clock, an input clock multiplying unit configured to frequency-multiply the input clock and output the resultant clock, and an operation clock selecting unit configured to select the output of the input clock dividing unit or the output of the input clock multiplying unit and output the selected output as the operation clock.

In this case, the digital PLL device further includes a frequency detecting unit configured to detect a frequency of the input clock and output a frequency detection result, wherein the operation clock selecting unit selects the output of the input clock dividing unit or the output of the input clock multiplying unit based on the frequency detection result.

In the digital PLL device according to the above aspect of the present invention, the n dividing unit frequency-divides the operation clock from the operation clock selecting unit instead of the input clock by n to output the reference signal, and the digital PLL device further includes: an output clock multiplying unit configured to frequency-multiply an output of the oscillating unit and output the resultant clock; an output clock dividing unit configured to frequency-divide the output of the oscillating unit and output the resultant clock; and an output clock selecting unit configured to select the output of the output clock multiplying unit or the output of the output clock dividing unit and output the selected output.

In this case, the digital PLL device further includes a frequency detecting unit configured to detect a frequency of the input clock and output a frequency detection result, the operation clock selecting unit selects the output of the input clock dividing unit or the output of the input clock multiplying unit based on the frequency detection result, and the output clock selecting unit selects the output of the output clock multiplying unit or the output of the output clock dividing unit based on the frequency detection result.

In the digital PLL device according to the above aspect of the present invention, the phase comparing unit operates according to the operation clock.

In the digital PLL device according to the above aspect of the present invention, the input clock is transmitted through a digital interface.

In the digital PLL device according to the above aspect of the present invention, the digital interface is IEEE 1394 or HDMI.

Effects of the Invention

As has been described above, the digital PLL device according to one aspect of the present invention can reduce the circuit scale, power consumption, jitter, and tracking time regardless of the transmitted clock rate, as compared to conventional digital PLL devices.

The transmitted clock rate has been rapidly increased due to, for example, an improved resolution resulting from Deep Color defined by the HDMI specification or recent increase in screen size of display devices. Accordingly, increase in circuit scale and increase in power consumption due to the high-speed operation, for example, can be suppressed by operating the digital PLL device based on a frequency-divided fast transmitted clock. In the case where the high-speed operation of the transmitted clock is not required such as in low-end devices, increase in jitter and increase in tracking time due to the low-speed operation, for example, can be suppressed by operating the digital PLL device based on a frequency-multiplied transmitted clock.

Figure 1:
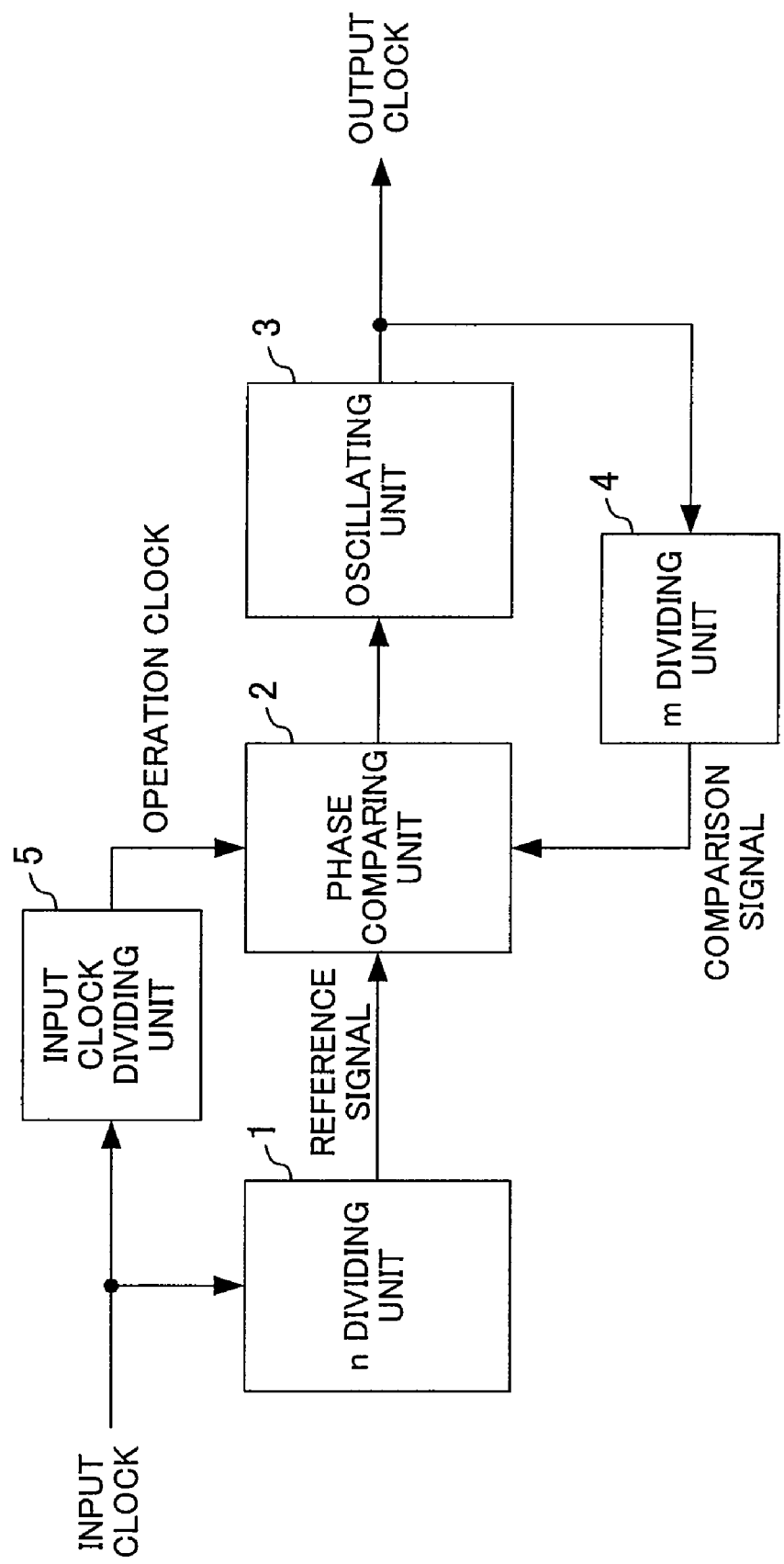
FIG. 1 is a block diagram showing a structure of a digital PLL device according to a first embodiment of the present invention.

DESCRIPTION OF THE REFERENCE NUMERALS 1 n dividing unit
2 phase comparing unit
3 oscillating unit
4 m dividing unit
5 input clock dividing unit
6 input clock multiplying unit
7 operation clock selecting unit
8 frequency detecting unit
9 output clock multiplying unit
10 output clock dividing unit
11 output clock selecting unit

BEST MODE FOR CARRYING OUT THE INVENTION

Hereinafter, embodiments of the present invention will be described with reference to the accompanying drawings.

First Embodiment

FIG. 1 is a block diagram showing a structure of a digital PLL device according to a first embodiment of the present invention.

The digital PLL device according to the first embodiment of the present invention shown in FIG. 1 includes an n dividing unit 1, a phase comparing unit 2, an oscillating unit 3, an m dividing unit 4, and an input clock dividing unit 5.

Operation of the digital PLL device of the present embodiment having the above structure will now be described.

As shown in FIG. 1, the n dividing unit 1 frequency-divides an input clock transmitted through a digital interface by n (n is a natural number) to generate a digital PLL reference signal. The input clock dividing unit 5 frequency-divides the input clock and outputs the resultant clock to the phase comparing unit 2 as an operation clock. The phase comparing unit 2 operates according to the operation clock received from the input clock dividing unit 5. The phase comparing unit 2 obtains the phase difference between the reference signal generated by the n dividing unit 1 and a comparison signal generated by frequency-dividing an output clock by m (m is a natural number) in the m dividing unit 4, and outputs a control signal so that the phase difference becomes zero. The oscillating unit 3 changes the output clock by the control signal received from the phase comparing unit 2.

Provided that the input clock frequency is x hertz and the output clock frequency is y hertz, the reference signal frequency is x/n hertz. Since the phase of the comparison signal tracks the phase of the reference signal, the comparison signal frequency is also x/n hertz. The output clock frequency is therefore y=(x×m)/n hertz. A desired output clock is thus obtained.

As has been described above, according to the digital PLL device of the first embodiment of the present invention, the phase comparing unit 2 can be operated by using a frequency-divided input clock as an operation clock. This structure suppresses increase in circuit scale and increase in power consumption caused by high-speed operation due to a high-speed transmitted clock, as compared to conventional digital PLL devices in which the phase comparing unit 2 is operated by using an input clock directly as an operation clock.

Note that the input clock and the frequency dividing parameters m and n may be transmitted through a digital interface. This structure is effective in the case where a clock cannot be transmitted directly but a clock synchronized with a transmitting party needs to be generated. Examples of such a digital interface include audio transmission of IEEE 1394 or HDMI.

Second Embodiment

Figure 2:
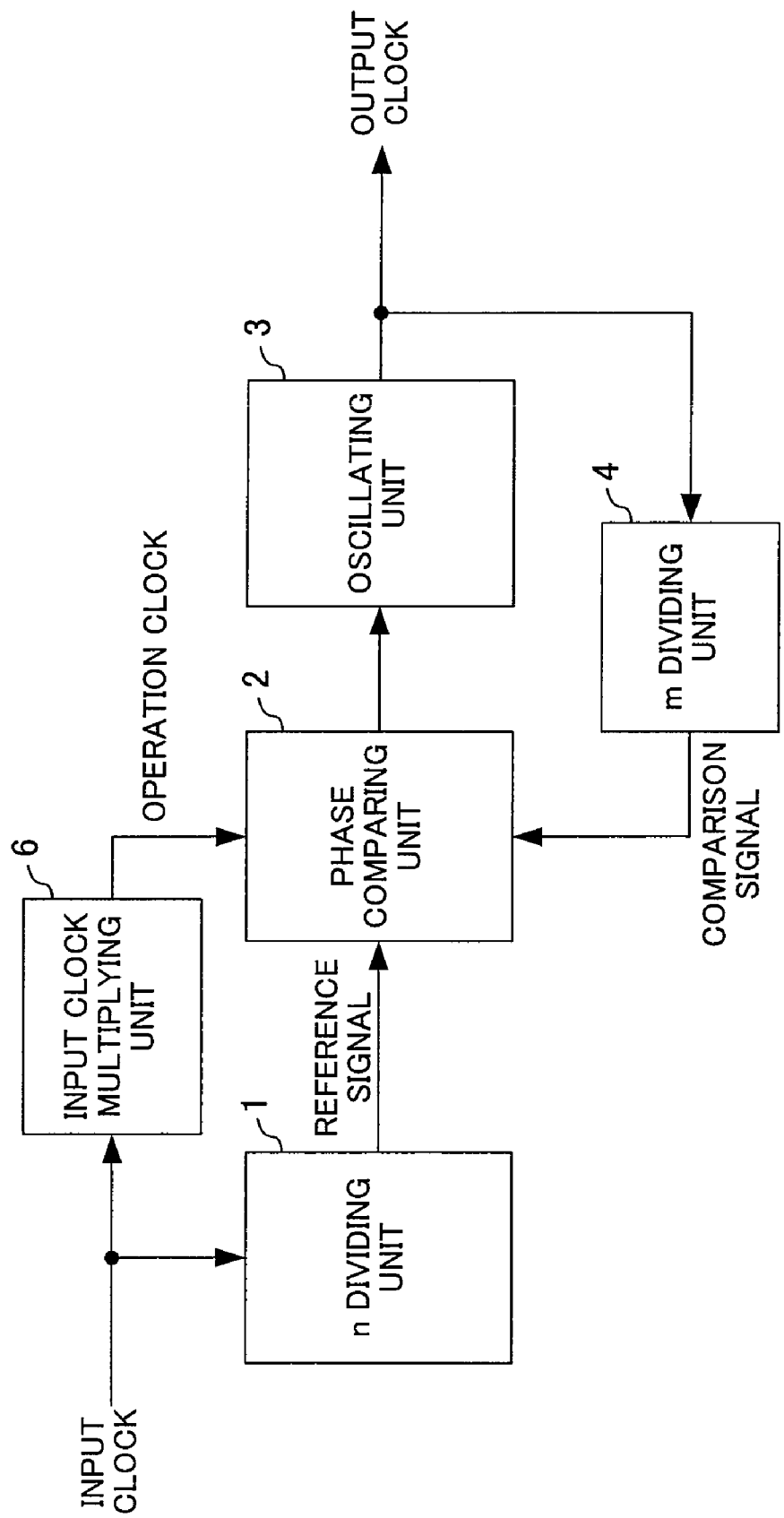
FIG. 2 is a block diagram showing a structure of a digital PLL device according to a second embodiment of the present invention.

FIG. 2 is a block diagram showing a structure of a digital PLL device according to a second embodiment of the present invention.

The digital PLL device according to the second embodiment of the present invention shown in FIG. 2 includes an n dividing unit 1, a phase comparing unit 2, an oscillating unit 3, an m dividing unit 4, and an input clock multiplying unit 6. Note that, as compared to the structure of the digital PLL device of the first embodiment shown in FIG. 1, the structure of the digital PLL device of the present embodiment is characterized by including the input clock multiplying unit 6 configured to frequency-multiply an input clock instead of the input clock dividing unit 5 of the first embodiment configured to frequency-divide an input clock.

Operation of the digital PLL device of the present embodiment having the above structure will now be described.

As shown in FIG. 2, the n dividing unit 1 frequency-divides an input clock transmitted through a digital interface by n to generate a digital PLL reference signal. The input clock multiplying unit 6 frequency-multiplies the input clock and outputs the resultant clock to the phase comparing unit 2 as an operation clock. The phase comparing unit 2 operates according to the operation clock received from the input clock multiplying unit 6. The phase comparing unit 2 obtains the phase difference between the reference signal generated by the n dividing unit 1 and a comparison signal generated by frequency-dividing an output clock by m in the m dividing unit 4, and outputs a control signal so that the phase difference becomes zero. The oscillating unit 3 changes the output clock by the control signal received from the phase comparing unit 2.

Provided that the input clock frequency is x hertz and the output clock frequency is y hertz, the reference signal frequency is x/n hertz. Since the phase of the comparison signal tracks the phase of the reference signal, the comparison signal frequency is also x/n hertz. The output clock frequency is therefore y=(x×m)/n hertz. A desired output clock is thus obtained.

As has been described above, according to the digital PLL device of the second embodiment of the present invention, the phase comparing unit 2 can be operated by using a frequency-multiplied input clock as an operation clock. This structure suppresses increase in jitter and increase in tracking time caused by low-speed operation due to a low-speed transmitted clock, as compared to conventional digital PLL devices in which the phase comparing unit 2 is operated by using an input clock directly as an operation clock.

Note that the input clock and the frequency dividing parameters m and n may be transmitted through a digital interface. This structure is effective in the case where a clock cannot be transmitted directly but a clock synchronized with a transmitting party needs to be generated. Examples of such a digital interface include audio transmission of IEEE 1394 or HDMI.

Third Embodiment

Figure 3:
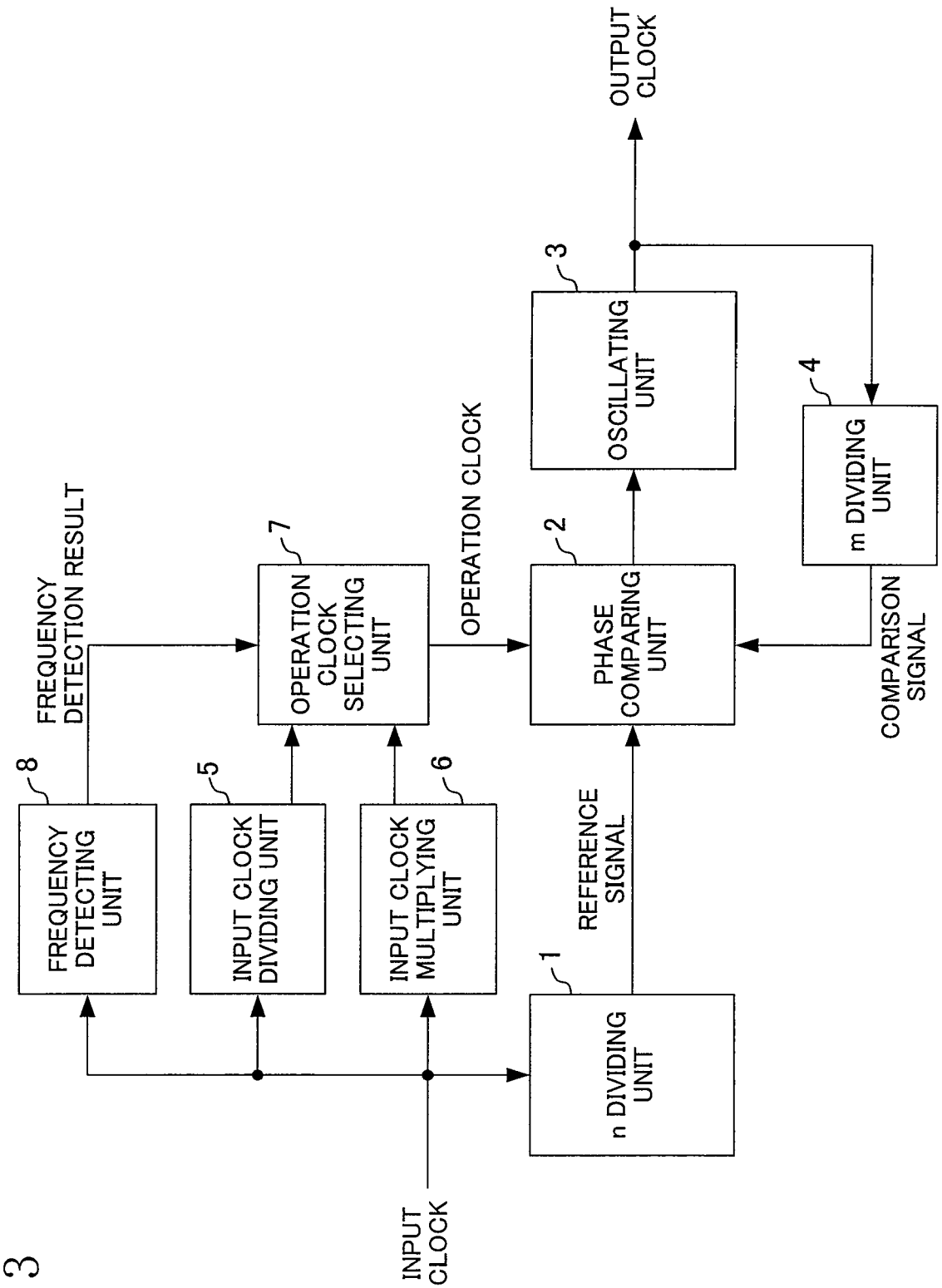
FIG. 3 is a block diagram showing a structure of a digital PLL device according to a third embodiment of the present invention.

FIG. 3 is a block diagram showing a structure of a digital PLL device according to a third embodiment of the present invention.

The digital PLL device according to the third embodiment of the present invention shown in FIG. 3 includes an n dividing unit 1, a phase comparing unit 2, an oscillating unit 3, an m dividing unit 4, an input clock dividing unit 5, an input clock multiplying unit 6, an operation clock selecting unit 7, and a frequency detecting unit 8.

As compared to the structures of the digital PLL devices of the first and second embodiments shown in FIGS. 1 and 2, the structure of the digital PLL device of the present embodiment is characterized by including the input clock dividing unit 5 of the first embodiment configured to frequency-divide an input clock and the input clock multiplying unit 6 of the second embodiment configured to frequency-multiply an input clock, and characterized by further including the operation clock selecting unit 7 configured to select the clock frequency-divided by the input clock dividing unit 5 or the clock frequency-multiplied by the input clock multiplying unit 6 and output the selected clock as an operation clock. The digital PLL device of the third embodiment may further include the frequency detecting unit 8 configured to detect an input clock frequency and output the detection result to the operation clock selecting unit 7 so that the operation clock selecting unit 7 can select an optimal operation clock.

The digital PLL device of the third embodiment of the present invention therefore has the effects of both the first and second embodiments described above. More specifically, as compared to conventional digital PLL devices in which the phase comparing unit 2 is operated by using an input clock directly as an operation clock, the digital PLL device of the third embodiment suppresses increase in circuit scale and increase in power consumption caused by high-speed operation due to a high-speed transmitted clock and also suppresses increase in jitter and increase in tracking time caused by low-speed operation due to a low-speed transmitted clock. Moreover, since the digital PLL device of the third embodiment includes the frequency detecting unit 8, an optimal operation clock can be selected according to the operation speed, based on the input clock frequency. The digital PLL device of the third embodiment can therefore operate rationally.

Note that the input clock and the frequency dividing parameters m and n may be transmitted through a digital interface. This structure is effective in the case where a clock cannot be transmitted directly but a clock synchronized with a transmitting party needs to be generated. Examples of such a digital interface include audio transmission of IEEE 1394 or HDMI.

Fourth Embodiment

Figure 4:
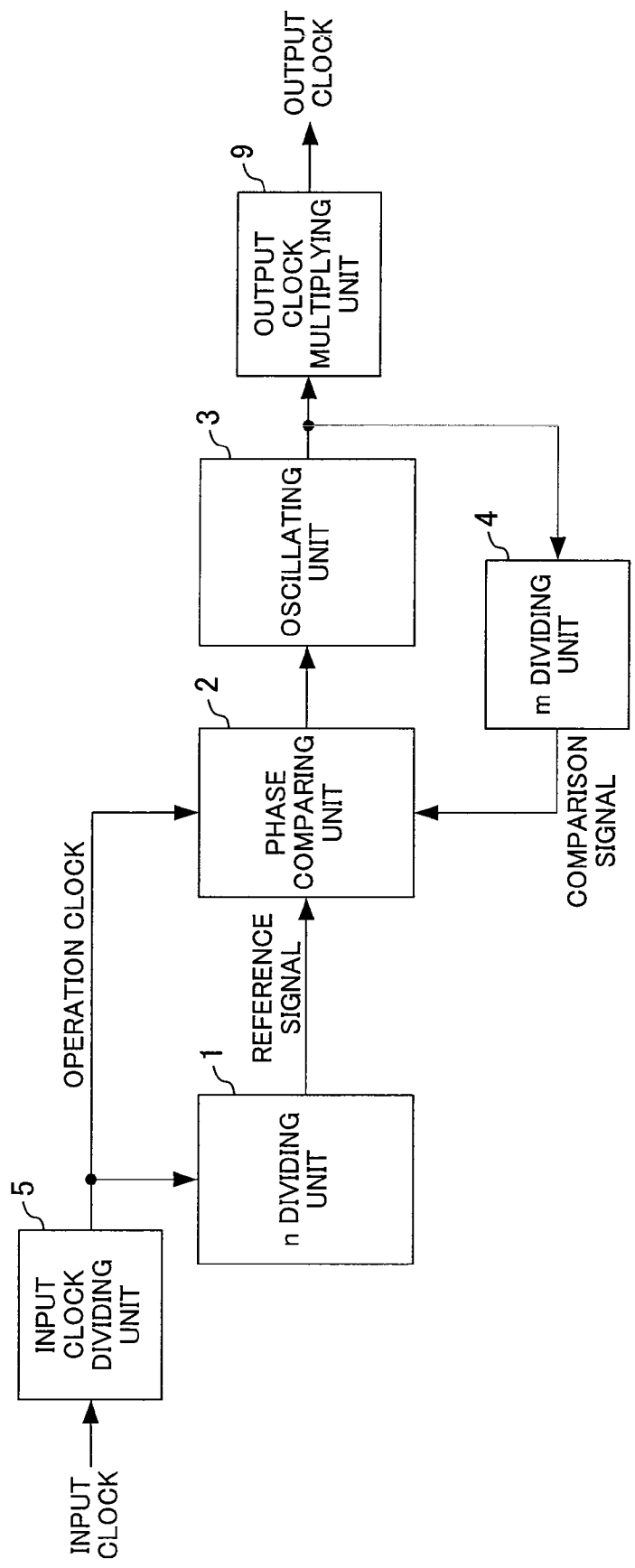
FIG. 4 is a block diagram showing a structure of a digital PLL device according to a fourth embodiment of the present invention.

FIG. 4 is a block diagram showing a structure of a digital PLL device according to a fourth embodiment of the present invention.

The digital PLL device according to the fourth embodiment of the present invention shown in FIG. 4 includes an n dividing unit 1, a phase comparing unit 2, an oscillating unit 3, an m dividing unit 4, an input clock dividing unit 5, and an output clock multiplying unit 9.

Operation of the digital PLL device of the present embodiment having the above structure will now be described.

As shown in FIG. 4, the input clock dividing unit 5 frequency-divides an input clock transmitted through a digital interface and outputs the resultant clock to the phase comparing unit 2 and also to the n dividing unit 1 as an operation clock. The n dividing unit 1 frequency-divides the clock received from the input clock dividing unit 5 by n to generate a digital PLL reference signal. The phase comparing unit 2 operates according to the operation clock received from the input clock dividing unit 5. The phase comparing unit 2 obtains the phase difference between the reference signal generated by the n dividing unit 1 and a comparison signal generated by frequency-dividing an output clock by m in the m dividing unit 4, and outputs a control signal so that the phase difference becomes zero. The oscillating unit 3 changes the output clock by the control signal received from the phase comparing unit 2. The output clock multiplying unit 9 frequency-multiplies the clock received from the oscillating unit 3 and outputs the resultant clock.

Provided that the input clock frequency is x hertz, the output clock frequency is y hertz, and the frequency-dividing factor of the input clock dividing unit 5 is a, the reference signal frequency is $x/(a \times n)$ hertz. Since the phase of the comparison signal tracks the phase of the reference signal, the comparison signal frequency is also $x/(a \times n)$ hertz. The output clock frequency of the oscillating unit 3 is therefore $y'=(x \times m)/(a \times n)$ hertz. A desired output clock is thus obtained by using the value a as a frequency-multiplying factor of the output clock multiplying unit 9.

As has been described above, according to the digital PLL device of the fourth embodiment of the present invention, the phase comparing unit 2 can be operated by using a frequency-divided input clock as an operation clock. This structure suppresses increase in circuit scale and increase in power consumption caused by high-speed operation due to a high-speed transmitted clock, as compared to conventional digital PLL devices in which the phase comparing unit 2 is operated by using an input clock directly as an operation clock.

Note that the input clock and the frequency dividing parameters m and n may be transmitted through a digital interface. This structure is effective in the case where a clock cannot be transmitted directly but a clock synchronized with a transmitting party needs to be generated. Examples of such a digital interface include audio transmission of IEEE 1394 or HDMI.

Fifth Embodiment

Figure 5:
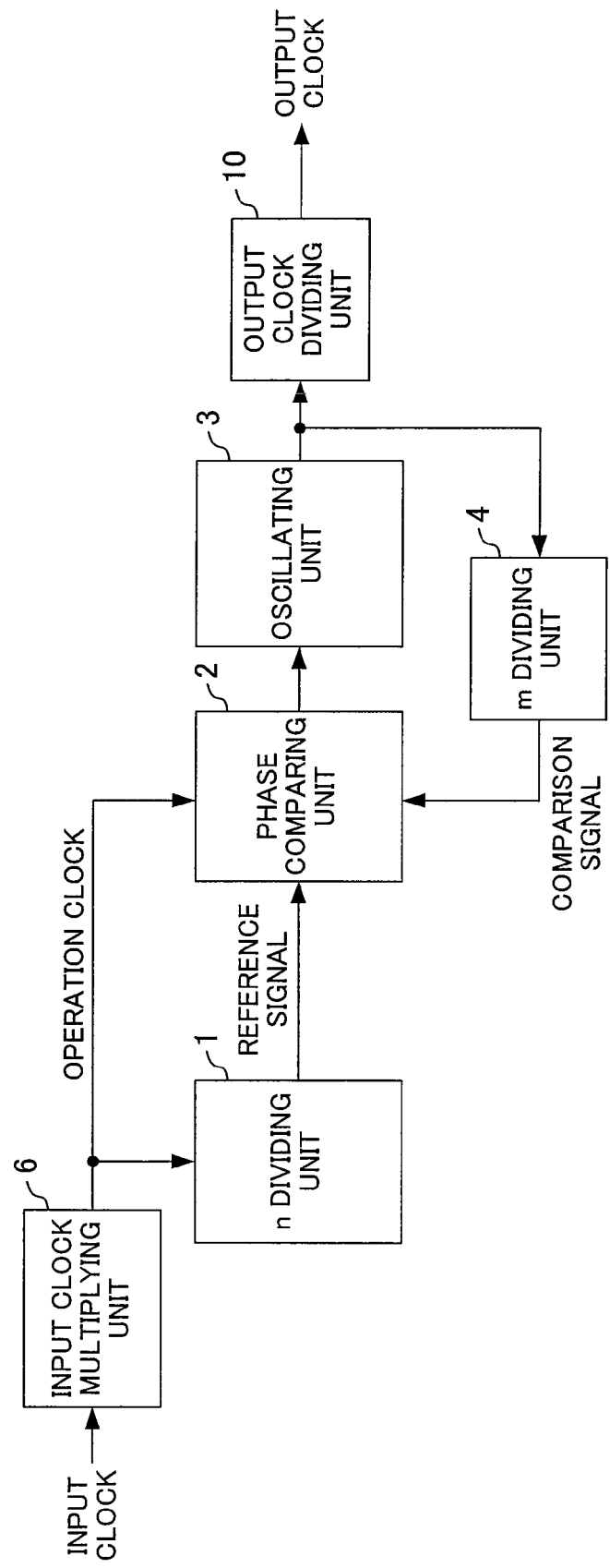
FIG. 5 is a block diagram showing a structure of a digital PLL device according to a fifth embodiment of the present invention.

FIG. 5 is a block diagram showing a structure of a digital PLL device according to a fifth embodiment of the present invention.

The digital PLL device according to the fifth embodiment of the present invention shown in FIG. 5 includes an n dividing unit 1, a phase comparing unit 2, an oscillating unit 3, an m dividing unit 4, an input clock multiplying unit 6, and an output clock dividing unit 10. Note that, as compared to the structure of the digital PLL device of the fourth embodiment shown in FIG. 4, the structure of the digital PLL device of the present embodiment is characterized by including the input clock multiplying unit 6 configured to frequency-multiply an input clock instead of the input clock dividing unit 5 configured to frequency-divide an input clock in the fourth embodiment, and by including the output clock dividing unit 10 configured to frequency-divide a clock received from the oscillating unit 3 and output the resultant clock instead of the output clock multiplying unit 9 configured to frequency-multiply a clock received from the oscillating unit 3 in the fourth embodiment.

Operation of the digital PLL device of the present embodiment having the above structure will now be described.

As shown in FIG. 5, the input clock multiplying unit 6 frequency-multiplies an input clock transmitted through a digital interface and outputs the resultant clock to the phase comparing unit 2 and also to the n dividing unit 1 as an operation clock. The n dividing unit 1 frequency-divides the clock received from the input clock multiplying unit 6 by n to generate a digital PLL reference signal. The phase comparing unit 2 operates according to the operation clock received from the input clock multiplying unit 6. The phase comparing unit 2 obtains the phase difference between the reference signal generated by the n dividing unit 1 and a comparison signal generated by frequency-dividing an output clock by m in the m dividing unit 4, and outputs a control signal so that the phase difference becomes zero. The oscillating unit 3 changes the output clock by the control signal received from the phase comparing unit 2. The output clock dividing unit 10 frequency-divides the clock received from the oscillating unit 3 and outputs the resultant clock.

Provided that the input clock frequency is x hertz, the output clock frequency is y hertz, and the frequency-multiplying factor of the input clock multiplying unit 6 is b, the reference signal frequency is $(x \times b)/n$ hertz. Since the phase of the comparison signal tracks the phase of the reference signal, the comparison signal frequency is also $(x \times b)/n$ hertz. The output clock frequency of the oscillating unit 3 is therefore $y'=(x \times b \times m)/n$ hertz. A desired output clock is thus obtained by using a frequency-dividing factor b in the output clock dividing unit 10.

As has been described above, according to the digital PLL device of the fifth embodiment of the present invention, the phase comparing unit 2 can be operated by using a frequency-multiplied input clock as an operation clock. This structure suppresses increase in jitter and increase in tracking time caused by low-speed operation due to a low-speed transmitted clock, as compared to conventional digital PLL devices in which the phase comparing unit 2 is operated by using an input clock directly as an operation clock.

Note that the input clock and the frequency dividing parameters m and n may be transmitted through a digital interface. This structure is effective in the case where a clock cannot be transmitted directly but a clock synchronized with a transmitting party needs to be generated. Examples of such a digital interface include audio transmission of IEEE 1394 or HDMI.

Sixth Embodiment

Figure 6:
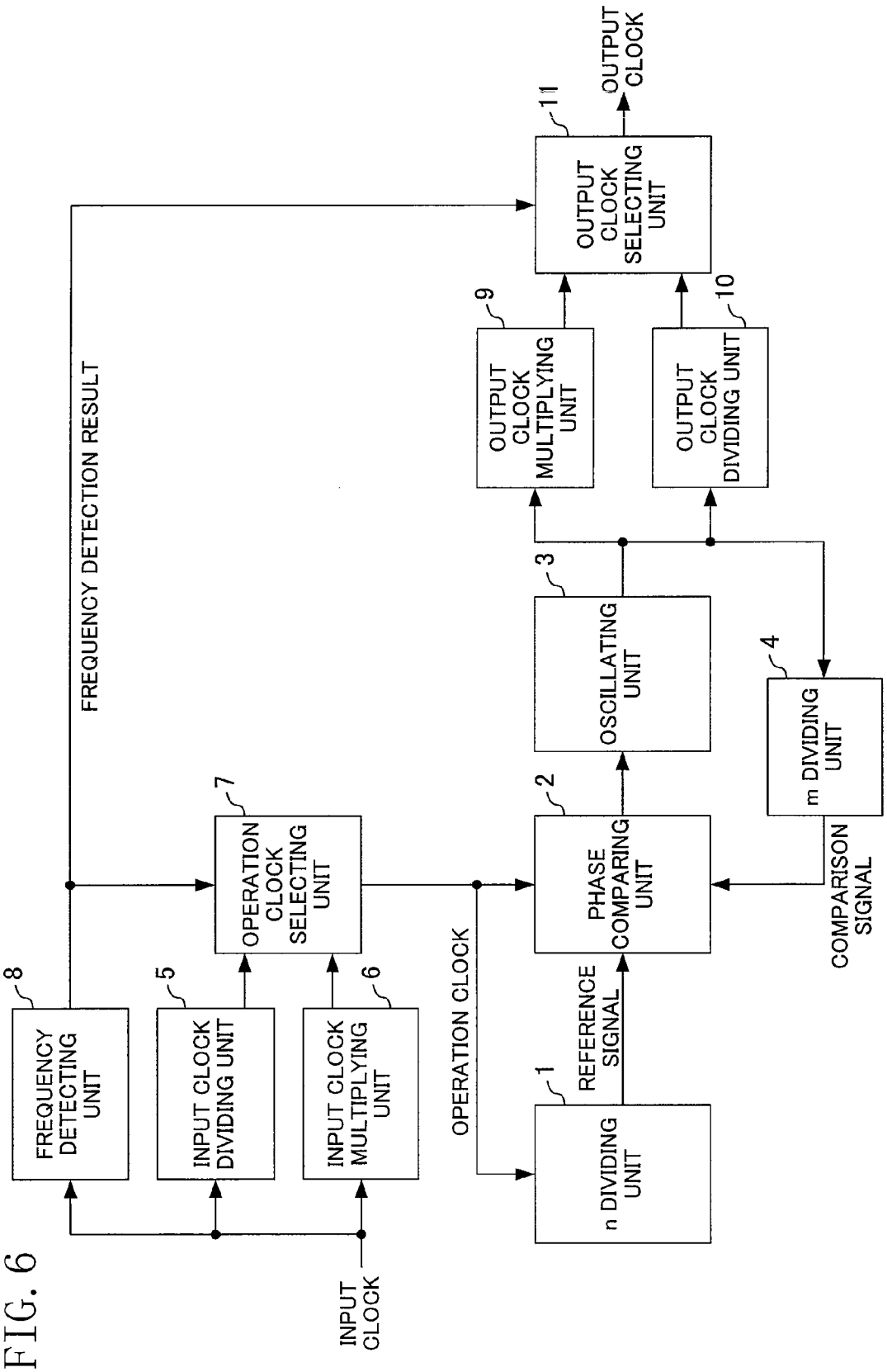
FIG. 6 is a block diagram showing a structure of a digital PLL device according to a sixth embodiment of the present invention.
Figure 7:
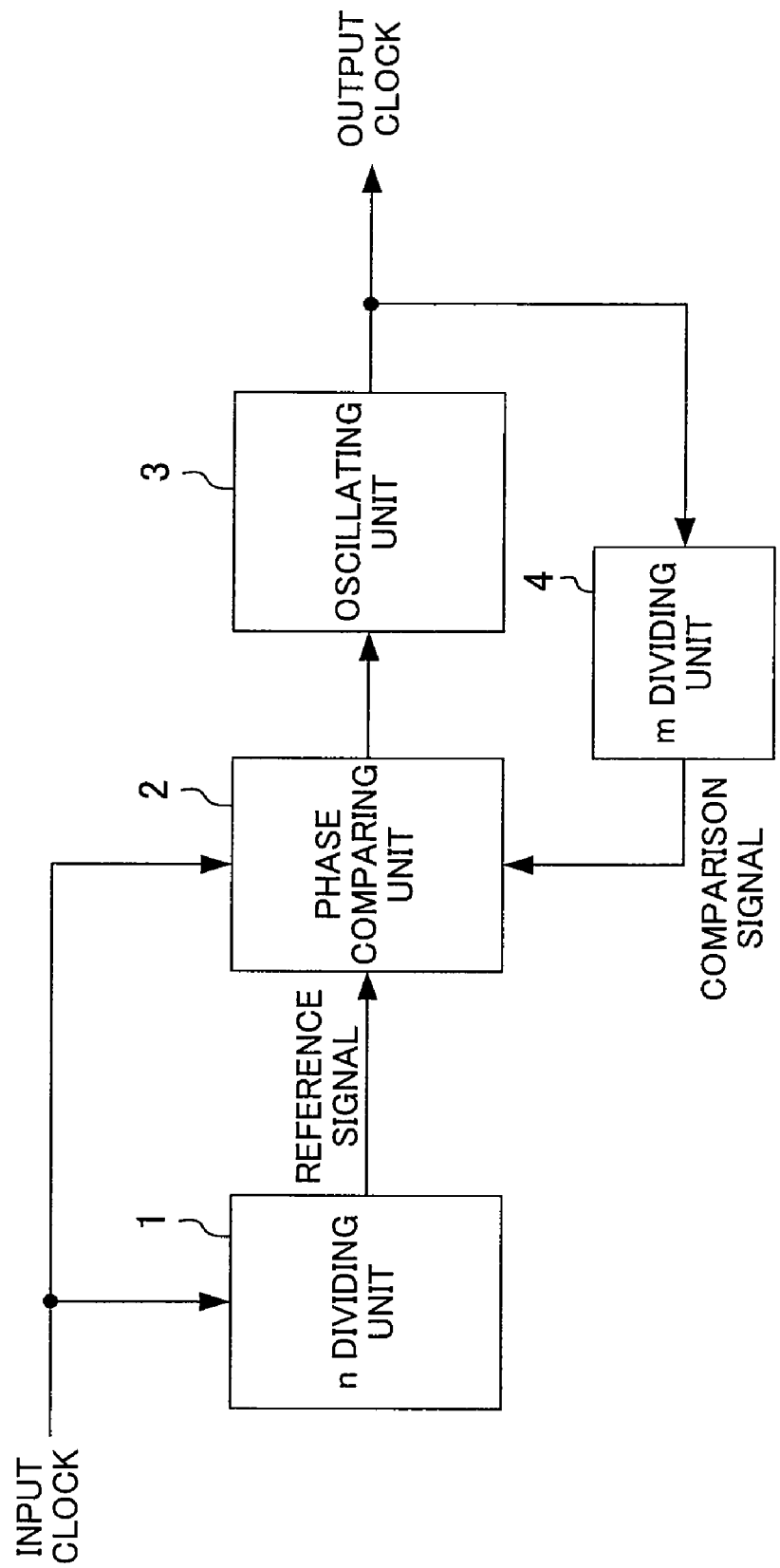
FIG. 7 is a block diagram showing a structure of a conventional digital PLL device.

FIG. 6 is a block diagram showing a structure of a digital PLL device according to a sixth embodiment of the present invention.

The digital PLL device according to the sixth embodiment of the present invention shown in FIG. 6 includes an n dividing unit 1, a phase comparing unit 2, an oscillating unit 3, an m dividing unit 4, an input clock dividing unit 5, an input clock multiplying unit 6, an operation clock selecting unit 7, a frequency detecting unit 8, an output clock multiplying unit 9, an output clock dividing unit 10, and an output clock selecting unit 11.

As compared to the structures of the digital PLL devices of the fourth and fifth embodiments shown in FIGS. 4 and 5, the structure of the digital PLL device of the present embodiment is characterized by including the input clock dividing unit 5 configured to frequency-divide an input clock in the fourth embodiment and the input clock multiplying unit 6 configured to frequency-multiply an input clock in the fifth embodiment, and by including the operation clock selecting unit 7 configured to select the clock frequency-divided by the input clock dividing unit 5 or the clock frequency-multiplied by the input clock multiplying unit 6 and output the selected clock to the n dividing unit 1 and the phase comparing unit 2. The structure of the digital PLL device of the present embodiment is also characterized by including the output clock multiplying unit 9 configured to multiply a clock received from the oscillating unit 3 and output the resultant clock and the output clock dividing unit 10 configured to frequency-divide a clock received from the oscillating unit 3 and output the resultant clock, and by including the output clock selecting unit 11 configured to select the clock frequency-multiplied by the output clock multiplying unit 9 or the clock frequency-divided by the output clock dividing unit 10 and output the selected clock. The digital PLL device of the present embodiment may further include the frequency detecting unit 8 configured to detect an input clock frequency and output the detection result to the operation clock selecting unit 7 and the output clock selecting unit 11, so that the operation clock selecting unit 7 and the output clock selecting unit 11 can select an optimal operation clock.

The digital PLL device of the sixth embodiment of the present invention therefore has the effects of both the fourth and fifth embodiments described above. More specifically, as compared to conventional digital PLL devices in which the phase comparing unit 2 is operated by using an input clock directly as an operation clock, the digital PLL device of the sixth embodiment suppresses increase in circuit scale and increase in power consumption caused by high-speed operation due to a high-speed transmitted clock and also suppresses increase in jitter and increase in tracking time caused by low-speed operation due to a low-speed transmitted clock. Moreover, since the digital PLL device of the sixth embodiment includes the frequency detecting unit 8, an optimal operation clock can be selected according to the operation speed, based on the input clock frequency. The digital PLL device of the sixth embodiment can therefore operate rationally.

Note that the input clock and the frequency dividing parameters m and n may be transmitted through a digital interface. This structure is effective in the case where a clock cannot be transmitted directly but a clock synchronized with a transmitting party needs to be generated. Examples of such a digital interface include audio transmission of IEEE 1394 or HDMI.

Industrial Applicability

The digital PLL device of the present invention is useful in the case where a clock cannot be transmitted directly but a clock synchronized with a transmitting party needs to be generated, such as when audio data is transmitted through a digital interface.

The digital PLL device of the present invention is particularly useful in the case where the transmitted clock rate is increased due to, for example, an improved resolution resulting from Deep Color defined by the HDMI specification or recent increase in size of display devices.

The invention claimed is:

1. A digital PLL device, comprising:
an operation clock generating unit configured to output as an operation clock a frequency-multiplied input clock;
an n dividing unit configured to output a reference signal to frequency-divide an input clock by n (n is a natural number);
a phase comparing unit configured to operate based on the operation clock and to output a control signal comparing the reference signal with a comparison signal;
an oscillating unit configured to change an oscillation frequency of an output clock according to the control signal; and
an m dividing unit configured to output the comparison signal to frequency-divide the output clock by m (m is a natural number).

2. A digital PLL device, comprising:
an operation clock generating unit configured to output as an operation clock a frequency-divided or frequency-multiplied' input clock;
an n dividing unit configured to output a reference signal to frequency-divide an input clock by n (n is a natural number);
a phase comparing unit configured to operate based on the operation clock and to output a control signal comparing the reference signal with a comparison signal;
an oscillating unit configured to change an oscillation frequency of an output clock according to the control signal; and
an m dividing unit configured to output the comparison signal to frequency-divide the output clock by m (m is a natural number),
wherein the operation clock generating unit is an output clock dividing unit configured to frequency-divide the input clock and output the resultant clock as the operation clock, and
the n dividing unit frequency-divides the operation clock instead of the input clock by n to output the reference signal, the digital PLL device further comprising an input clock multiplying unit configured to frequency-multiply an output of the oscillating unit and output the resultant clock.

3. A digital PLL device, comprising:
an operation clock generating unit configured to output as an operation clock a frequency-divided or frequency-multiplied input clock;
an n dividing unit configured to output a reference signal to frequency-divide an input clock by n (n is a natural number);
a phase comparing unit configured to operate based on the operation clock and to output a control signal comparing the reference signal with a comparison signal;
an oscillating unit configured to change an oscillation frequency of an output clock according to the control signal; and
an m dividing unit configured to output the comparison signal to frequency-divide the output clock by m (m is a natural number), wherein the operation clock generating unit is an input clock multiplying unit configured to frequency-multiply the input clock and output the resultant clock as the operation clock.

4. The digital PLL device according to claim 3, wherein the n dividing unit frequency-divides the operation clock instead of the input clock by n to output the reference signal, the digital PLL device further comprising an output clock dividing unit configured to frequency-divide an output of the oscillating unit and output the resultant clock.

5. A digital PLL device, comprising:
an operation clock generating unit configured to output as an operation clock a frequency-divided or frequency-multiplied input clock;
an n dividing unit configured to output a reference signal to frequency-divide an input clock by n (n is a natural number);
a phase comparing unit configured to operate based on the operation clock and to output a control signal comparing the reference signal with a comparison signal;
an oscillating unit configured to change an oscillation frequency of an output clock according to the control signal; and
an m dividing unit configured to output the comparison signal to frequency-divide the output clock by m (m is a natural number),
wherein the operation clock generating unit further includes an input clock dividing unit configured to frequency-divide the input clock and output the resultant clock, an input clock multiplying unit configured to frequency-multiply the input clock and output the resultant clock, and an operation clock selecting unit configured to select the output of the input clock dividing unit or the output of the input clock multiplying unit and output the selected output as the operation clock.

6. The digital PLL device according to claim 5, further comprising a frequency detecting unit configured to detect a frequency of the input clock and output a frequency detection result, wherein the operation clock selecting unit selects the output of the input clock dividing unit or the output of the input clock multiplying unit based on the frequency detection result.

7. The digital PLL device according to claim 5, wherein the n dividing unit frequency-divides the operation clock from the Operation clock selecting unit instead of the input clock by n to output the reference signal, the digital PLL device further comprising:
an output clock multiplying unit configured to frequency-multiply an output of the oscillating unit and output the resultant clock;
an output clock dividing unit configured to frequency-divide the output of the oscillating unit and output the resultant clock; and
an output clock selecting unit configured to select the output of the output clock multiplying unit or the output of the output clock dividing unit and output the selected output.

8. The digital PLL device according to claim 7, further comprising a frequency detecting unit configured to detect a frequency of the input clock and output a frequency detection result, wherein the operation clock selecting unit selects the output of the input clock dividing unit or the output of the input clock multiplying unit based on the frequency detection result, and the output clock selecting unit selects the output of the output clock multiplying unit or the output of the output clock dividing unit based on the frequency detection result.

9. The digital PLL device according to any one of claims 1 and 2 to 8, wherein the phase comparing unit operates according to the operation clock.

10. The digital PLL device according to any one of claims 1 and 2-8, wherein the input clock is transmitted through a digital interface.

11. The digital PLL device according to claim 10, wherein the digital interface is IEEE 1394 or HDMI.

* * * * *